(12) United States Patent
Yen et al.

(10) Patent No.: US 12,504,391 B2
(45) Date of Patent: Dec. 23, 2025

(54) SYSTEM FOR MONITORING WAFER CARRIER AND METHOD OF MANUFACTURING SEMICONDUCTOR STRUCTURE

(71) Applicant: TAIWAN SEMICONDUCTOR MANUFACTURING COMPANY LTD., Hsinchu (TW)

(72) Inventors: Hsu Tung Yen, Kaohsiung (TW); Ling-Sung Wang, Tainan (TW); Chen-Chieh Chiang, Kaohsiung (TW); Bo Hsiang Huang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 216 days.

(21) Appl. No.: 18/459,369

(22) Filed: Aug. 31, 2023

(65) Prior Publication Data
US 2025/0076230 A1 Mar. 6, 2025

(51) Int. Cl.
*G01N 24/08* (2006.01)
*H01L 21/677* (2006.01)

(52) U.S. Cl.
CPC ......... *G01N 24/085* (2013.01); *G01N 24/082* (2013.01); *H01L 21/67733* (2013.01)

(58) Field of Classification Search
CPC ................ G01N 24/085; G01N 24/082; H01L 21/67733
See application file for complete search history.

(56) References Cited

U.S. PATENT DOCUMENTS 6,748,293 B1 * 6/2004 Larsen .................. H01L 21/681
414/811
7,379,174 B2 * 5/2008 Miyajima ........... G03F 7/70741
356/237.4

(Continued)

FOREIGN PATENT DOCUMENTS

CN 116540649 A * 8/2023 ......... G05B 19/4189
CN 117309821 A * 12/2023 ....... H01L 21/67253

(Continued)

OTHER PUBLICATIONS

CN 117309821 A, English language translation "Device For Detecting Gas in Wafer Transfer Box, Has Light Emitter For Emitting Test Light, and Controller Connected With Signal Detector and Used For Processing Light Intensity Signal so as to Determine Content of Each Gas in Gas Component" (Year: 2023).*

(Continued)

*Primary Examiner* — Anita K Alanko
(74) *Attorney, Agent, or Firm* — WPAT LAW; Anthony King

(57) ABSTRACT

A system for monitoring a wafer carrier includes an overhead hoist transport (OHT) vehicle, a scanner, and a processor. The OHT vehicle is configured to transport the wafer carrier along a vertical direction. The scanner is disposed below the OHT vehicle, wherein the wafer carrier is transported vertically by the OHT vehicle to pass through the scanner, and the scanner at least scans a lower portion of the wafer carrier along a horizontal direction and an upper portion of the wafer carrier along the horizontal direction. The processor is coupled to the scanner, wherein the processer receives a scanning result from the scanner after the wafer carrier is scanned, and the scanning result includes information of a gas composition within the wafer carrier. A (Continued)

method of manufacturing a semiconductor structure including a scanning procedure is also provided.

20 Claims, 15 Drawing Sheets

(56) References Cited

U.S. PATENT DOCUMENTS

| | | | | |
|---|---|---|---|---|
| 10,156,478 | B2* | 12/2018 | Liu | G01J 5/025 |
| 11,551,955 | B2* | 1/2023 | Lai | G05B 19/4189 |
| 11,848,221 | B2* | 12/2023 | Chiu | H01L 21/677 |
| 12,050,153 | B2* | 7/2024 | Huang | G07C 5/008 |
| 2006/0278612 | A1* | 12/2006 | Tokunaga | H01L 21/67167 |
| | | | | 216/58 |
| 2024/0347359 | A1* | 10/2024 | Wang | H01L 21/67386 |

FOREIGN PATENT DOCUMENTS

| | | | | | |
|---|---|---|---|---|---|
| KR | 20190016887 | A | * | 2/2019 | ....... H01L 21/67242 |
| KR | 102267278 | B1 | * | 6/2021 | ............... G01N 1/14 |

OTHER PUBLICATIONS

CN 116540649 A, English language translation "Intelligent Environment And Safety Monitoring Method And Monitoring System" (Year: 2023).*

KR 2019-0016887 A, English language translation "Internal Contamination Measurement Device For Front Open Unified Pod and Measurement Method of the Same" (Year: 2019).*

KR 102267278 B1, English-language translation, "Internal Pollution Sampling Device For Front Open Unified Pod and Wafer and Sampling Method of the Same" (Year: 2021).*

* cited by examiner

SYSTEM FOR MONITORING WAFER CARRIER AND METHOD OF MANUFACTURING SEMICONDUCTOR STRUCTURE

BACKGROUND

The semiconductor industry has experienced rapid growth due to continuous improvements in integration density of various electronic components (i.e., transistors, diodes, resistors, capacitors, etc.). For the most part, this improvement in integration density has come from repeated reductions in minimum feature size, which allows greater numbers of smaller components to be integrated into a given area. As feature size shrinks, associated circuits become more sensitive to contamination during manufacturing processes. Many manufacturing procedures may result in residues on a workpiece and residue vapor in a transporting carrier (such as front-opening unified pods (FOUPs)) that may accumulate within and contaminate the transporting carrier. Contamination of the transporting carrier may result in contamination of other workpieces subsequently loaded into the transporting carrier.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, dimensions of the various features may be arbitrarily increased or reduced for clarity of discussion.

DETAILED DESCRIPTION

Figure 1:
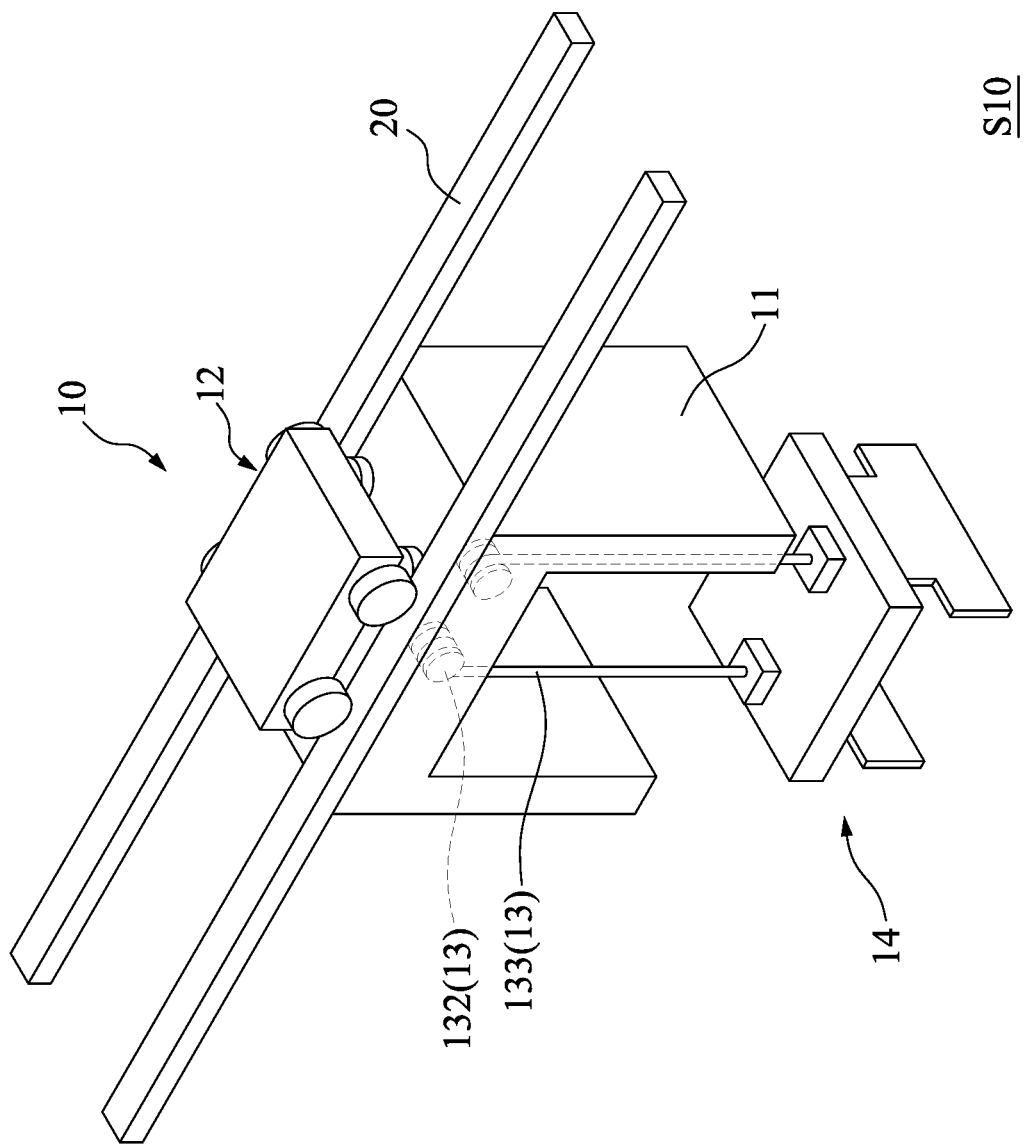
FIG. 1 is a schematic diagram of a conveying system in accordance with various embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context. In addition, the term "source/drain region" or "source/drain regions" may refer to a source or a drain, individually or collectively dependent upon the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from normal deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A conveying system is utilized during semiconductor fabrication. The conveying system includes a conveying unit configured to travel along a rail and carry a workpiece or a semiconductor structure from one processing machine to another. The conveying unit is able to lift a carrier for carrying semiconductor structures or workpieces from a load port of a machine station and move the carrier along the rail to another machine station. For example, Automated Material Handling Systems (AMHS) have been widely used in semiconductor fabrication to automatically handle and transport groups of the workpieces between various processing instruments. There are numerous types of automated vehicles (including automated guided vehicles (AGV), rail-guided vehicles (RGV), overhead hoist transport (OHT), and the like) for moving and transporting carriers (such as front-opening unified pods (FOUPs)) carrying the workpieces during fabrication. For instance, an OHT system includes automatically-moving OHT vehicles carrying workpieces from a load port of one processing instrument to a load port of another processing instrument. The workpieces are loaded into, for example, a FOUP after a manufacturing procedure in a chamber.

Many of the manufacturing procedures carried out may result in residues on a workpiece that are capable of damaging the electronic components. After the workpieces are loaded into the FOUP, inert gases may be provided into the FOUP, and residues on the workpiece can be thereby mixed with the inert gases. The residues may attach within and contaminate the transporting carrier. Contamination of the FOUP may result in contamination of other workpieces being loaded into the transporting carrier thereafter. In addition, the workpieces may emit outgassing gases in the FOUP during transportation. Similar to the residues, the outgassing gases can also result in contamination of the FOUP during transportation. Even gas suction unit or other related function unit for ventilation, a monitoring method for a gas composition within the FOUP or a transporting carrier is still necessary to examine or determine if the FOUP is contaminated or not.

Figure 2:
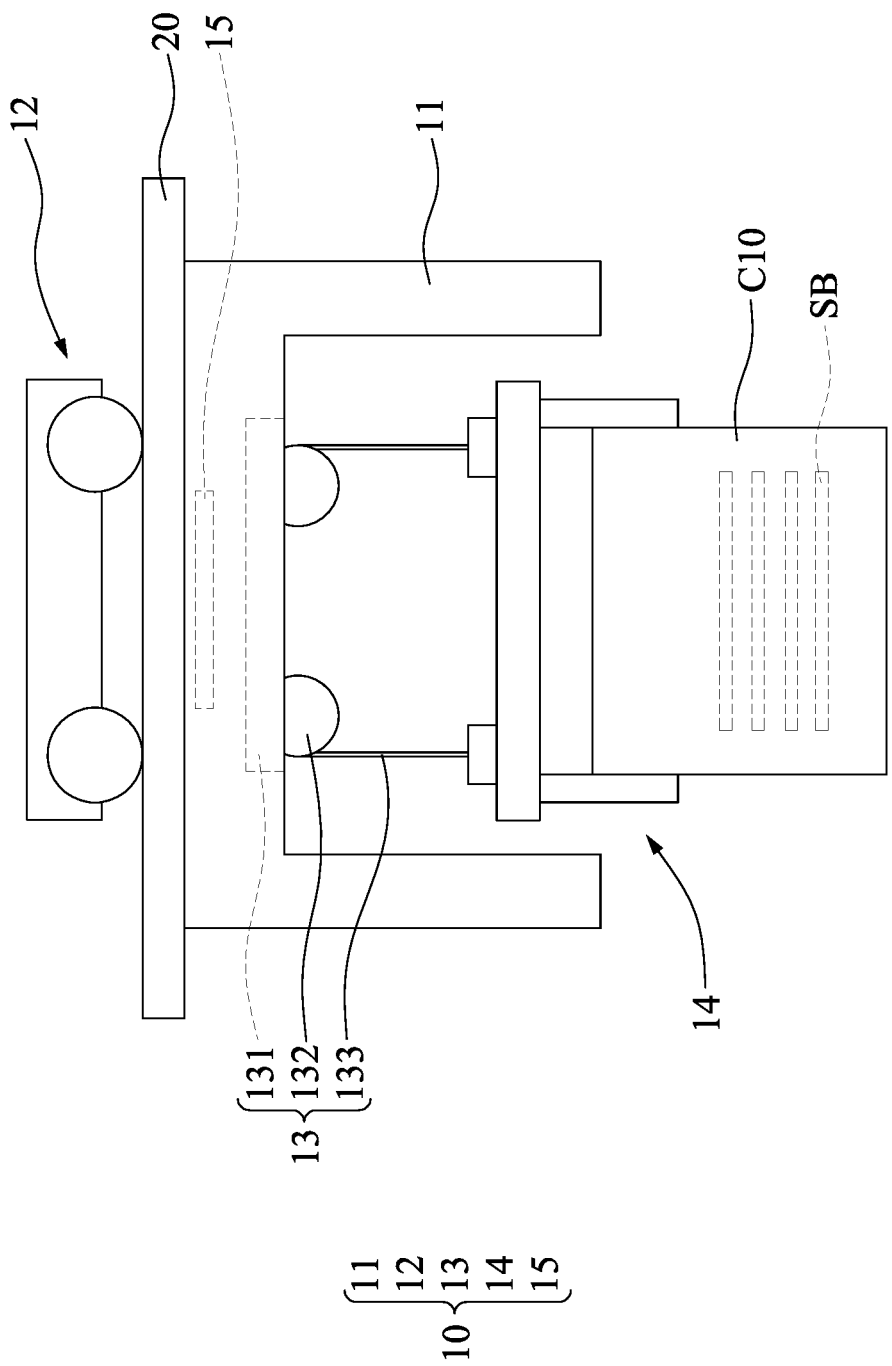
FIG. 2 is a schematic cross-sectional diagram illustrating the conveying system of FIG. 1 carrying a carrier.

FIG. 1 is a schematic diagram of a conveying system S10 in accordance with various embodiments of the present disclosure. The conveying system S10 functions to transport a carrier between locations during a semiconductor fabrication in a factory. FIG. 2 is a schematic cross-sectional diagram illustrating the conveying system S10 of FIG. 1 carrying a carrier C10. In some embodiments, the conveying system S10 is an overhead hoist transport (OHT) system. The conveying system S10 includes an OHT vehicle 10 and a rail 20. The OHT vehicle 10 is configured to carry the carrier C10 and travel along the rail 20. In some embodiments, the OHT vehicle 10 can include a housing 11, a travelling member 12, a hoisting member 13 and a gripping member 14.

The travelling member 12 is configured to moveably mount the OHT vehicle 10 to the rail 20. In some embodiments, the travelling member 12 can be a wheeled trolley, which is configured to complement and cooperate with the rail 20 for lateral or horizontal rolling movement along the rail 20. In other words, the OHT vehicle 10 is suspended on the rail 20 through the travelling member 12. The housing 11 of the OHT vehicle 10 can be a rigid frame surrounding several components, such as the hoisting member 13 and the gripping member 14. In some embodiments, the housing 11 is mounted on the travelling member 12. The carrier C10 can be a FOUP, a standard mechanical interface (SMIF) pod, or the like. In some embodiments, the gripping member 14 is configured to grip the carrier C10 for carrying a substrate SB. The substrate SB can be a workpiece, a semiconductor substrate, a semiconductor structure or a package. In some embodiments, the substrate SB includes semiconductive materials such as silicon and/or other suitable materials. In some embodiments, the substrate SB includes circuitries or electrical components disposed on a semiconductor substrate. In some embodiments, a lot or a group of substrates SB are disposed inside the carrier C10 to isolate the substrates SB from a surrounding environment and prevent contamination from the environment.

In some embodiments, the gripping member 14 is configured to securely hold and release the carrier C10 in order to transport the substrate SB along the rail 20 from one location to another. In some embodiments, the gripping member 14 is connected to the housing 11 through the hoisting member 13. The hoisting member 13 is configured to lift and lower the carrier C10 along a vertical direction. The hoisting member 13 is extendable from and retractable toward the housing 11 so as to change a vertical position of the carrier C10. In some embodiments, the hoisting member 13 connects the housing 11 to the gripping member 14. In some embodiments, the hoisting member 13 includes a hoisting motor 131, at least a wheel 132 and at least a belt 133. The hoisting motor 131 is configured to actuate the wheel 132 such that the wheel 132 can be rotated and the belt 133, which is connected to the wheel 132, can be vertically extended from or retracted toward the wheel 132. When the belt 133 is in a retracted status upon movement of the OHT vehicle 10 along the rail 20, the carrier C10 can be disposed inside or outside the housing 11 depending on different applications.

In some embodiments, the OHT vehicle 10 can further include a control unit 15 installed on the housing 11. The configuration shown in FIG. 2 is provided for illustration purposes, and a specific location of the control unit 15 on the housing 11 is not limited herein. The control unit 15 is configured to receive a signal or instruction of a location and a movement of the OHT vehicle 10. In some embodiments, the control unit 15 controls a horizontal movement (or a horizontal location) of the OHT vehicle 10 through the travelling member 12 according to the signal or instruction. In some embodiments, the control unit 15 controls a vertical movement (or a vertical location) of the OHT vehicle 10 through the hoisting member 13 according to the signal or instruction. The control unit 15 may be further configured to transmit a signal of the location of the OHT vehicle 10 for identification of the location of the OHT vehicle 10.

Figure 3:
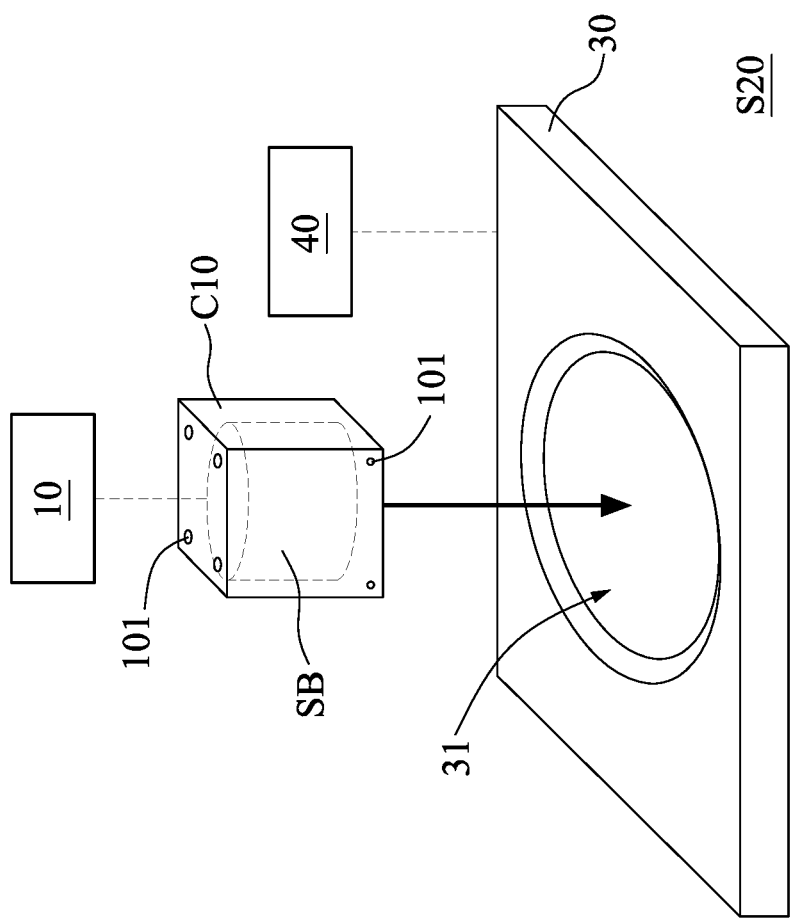
FIG. 3 is a schematic diagram of a system for monitoring a carrier in accordance with some embodiments of the present disclosure.

FIG. 3 shows a schematic diagram of a system S20 for monitoring a carrier C10 in accordance with some embodiments of the present disclosure. The system S20 may include a scanner 30 and a processor 40. In some embodiments, the scanner 30 performs magnetic resonance spectroscopy (MRS) or magnetic resonance imaging (MRI). In some embodiments, the scanner 30 includes a passage 31, which is a hollow through hole, to allow the carrier C10 to pass through. In some embodiments, the carrier C10 is lifted or lowered by the OHT vehicle 10 shown in FIGS. 1 and 2. In some embodiments, the carrier C10 is moved vertically to pass through the passage 31 of the scanner 30, wherein a moving direction of the carrier C10 is indicated by a thick arrow. It should be noted that detailed structure and functions of the OHT vehicle 10 are described above and illustrated in FIGS. 1 and 2. For a purpose of simplicity of drawings, the OHT vehicle 10 is depicted in FIG. 3 as a block, and connection between the carrier C10 and the OHT vehicle 10 is depicted in FIG. 3 as a dotted line. However, such depiction is not intended to limit the present disclosure.

The scanner 30 is configured to detect a gas composition of an environment inside the carrier C10. As described above, due to outgassing, the substrates SB in the carrier C10 may emit gases, or residues may be detached from the substrates SB and diffused into air in the carrier C10. In order to examine and monitor whether the carrier C10 is contaminated, the carrier C10 is moved toward the scanner 30 for MRI or MRS examination. A scanning result from the scanner 30 may be transmitted to the processor 40. In some embodiments, the scanning result of the carrier C10 is processed by the processor 40 to determine whether the carrier C10 is contaminated. The scanning result can be presented in a form of spectra showing chemical shifts (ppm) of the gas composition. In some embodiments, the scanning result is presented in a form of images with different gray scales indicating different concentrations of different chemicals of the gas composition.

The substrates SB are loaded into the carrier C10 for transportation by the OHT vehicle 10 between load ports of different processing instruments. Among many manufacturing procedures, an etching operation is particularly prone to residue or outgassing issues. For example, hydrogen ($H_2$), ammonia ($NH_3$), dihydrogen oxide ($H_2O$), and chlorine ($Cl_2$) are easily detected in the carrier C10 when the etching operation is performed on the substrates SB before the substrates SB are disposed in the carrier C10. In some embodiments, the substrates SB are loaded into the carrier C10 after the etching operation, and the carrier C10 is then transported to the scanner 30. In some embodiments, a scanning is performed after the etching operation for a purpose of instant examination and accurate statistical analysis of the gas composition of the air in the carrier C10 after the etching operation. In some embodiments, the carrier C10 is moved toward the scanner 30 for scanning prior to transportation to a load port for loading the substrates SB. Since the carrier C10 is repeatedly used during the manufacturing process, emitted gases or residues from a previous lot of the substrates SB may contaminate a next lot of the substrates SB. Therefore, an empty carrier C10 may be scanned prior to loading of the next lot of substrates SB, especially after a previous lot of substrates SB has been loaded into and removed from the carrier C10 after an etching operation.

The carrier C10 may include metallic components (or magnetic components) 101, such as screws. For a purpose of accurate scanning result and prevention of signal interference, the carrier C10 is scanned on a portion without the metallic components 101 or a substrate SB, which may have electrical elements formed thereon. In some embodiments, an empty carrier C10 is scanned and the scanning result is stored in the processor 40 or in a storage medium, from which the processor 40 is able to access the scanning result. In some embodiments, the scanning operation is performed on the carrier C10 during a semiconductor manufacturing process, and the scanning result is used to eliminate the signal interference of the metallic components 101 to generate a gas composition of a corrected scanning result.

Figure 4:
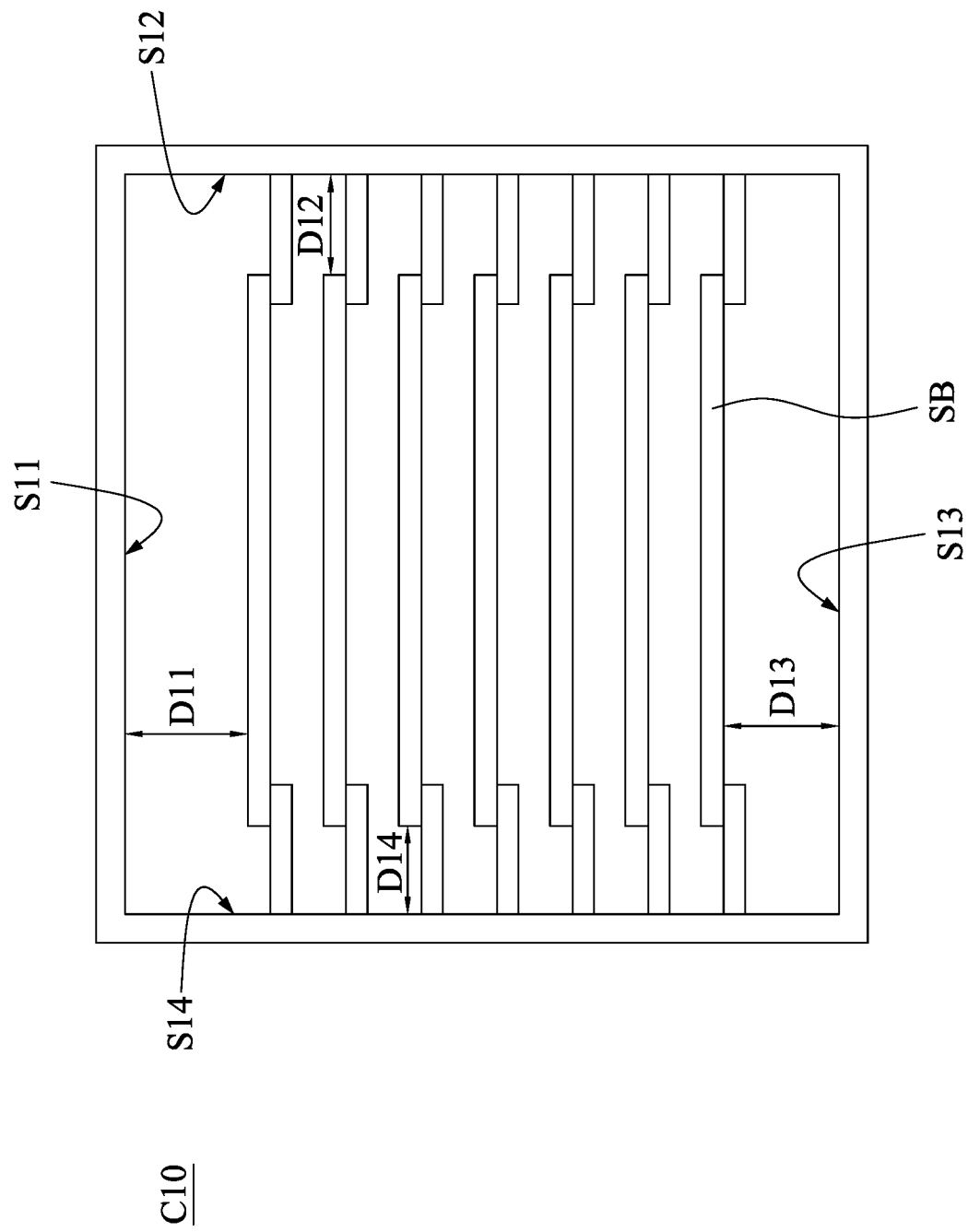
FIG. 4 is a schematic cross-sectional diagram of a carrier having multiple substrate disposed therein in accordance with some embodiments of the present disclosure.
Figure 5:
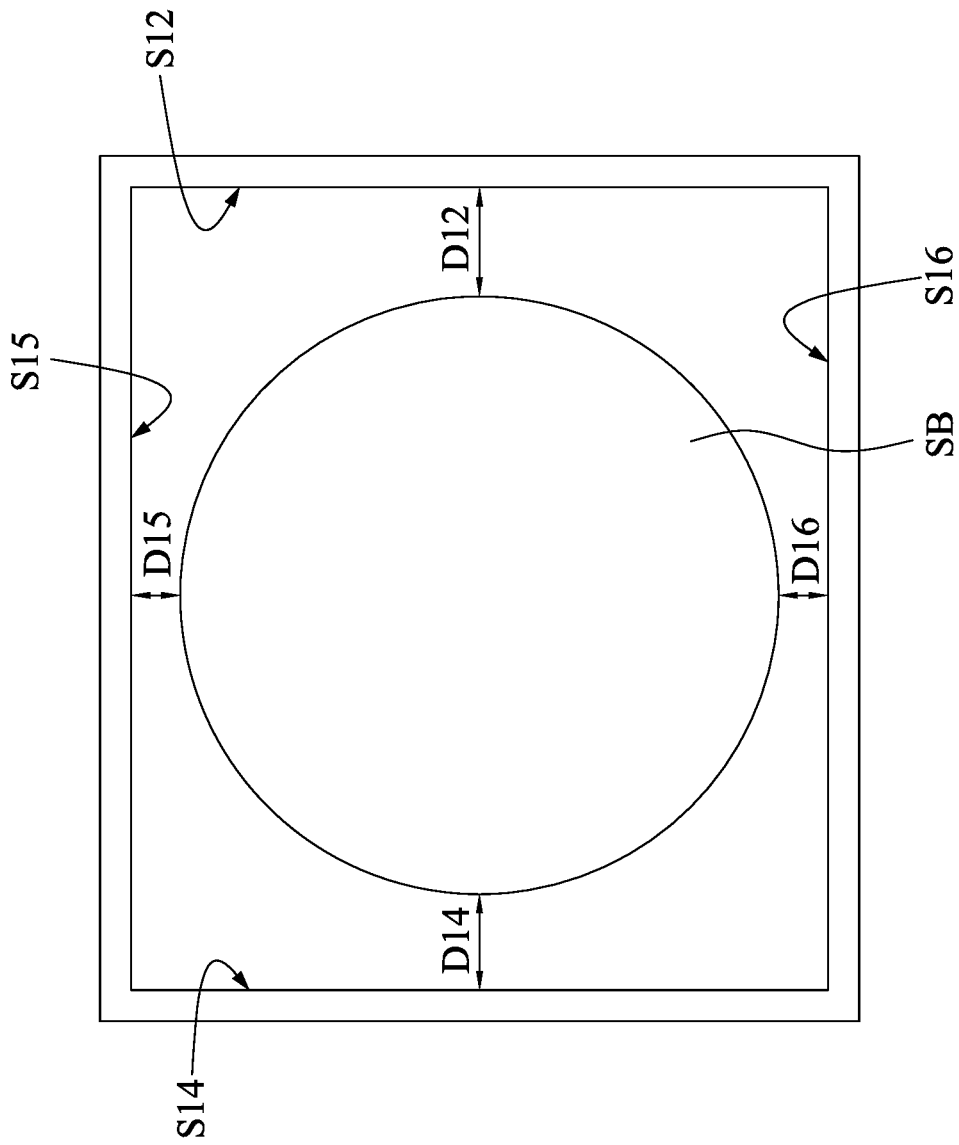
FIG. 5 is a schematic top-view perspective of a carrier having a substrate disposed therein in accordance with some embodiments of the present disclosure.

FIG. 4 shows a schematic cross-sectional diagram of the carrier C10 having multiple substrate SB disposed therein, and FIG. 5 shows a schematic top-view perspective of the carrier C10 in accordance with some embodiments of the present disclosure. The carrier C10 can be a box-like container having an inner top surface S11 and an inner bottom surface S13 opposite to the inner top surface S11. The carrier C10 further includes four inner sidewalls S12, S14, S15 and S16 connecting the inner top surface S11 and the inner bottom surface S13, wherein the inner sidewall S12 is opposite to the inner sidewall S14, and the inner sidewall S15 is opposite to the inner sidewall S16.

In some embodiments, a distance D11 between the inner top surface S11 and a topmost substrate SB is about 4 centimeters (cm). In some embodiment, the scanner 30 scans the carrier C10 at a horizontal level below the inner top surface S11 of the carrier C10 by a distance greater than zero and less than 4 cm for a purpose of prevention of signal interference. In some embodiments, a distance D13 between the inner bottom surface S13 and a bottom-most substrate SB is about 6 centimeters (cm). In some embodiment, the scanner 30 scans the carrier C10 at a horizontal level above the inner bottom surface S13 of the carrier C10 by a distance greater than zero and less than 6 cm for a purpose of prevention of signal interference.

Figure 9:
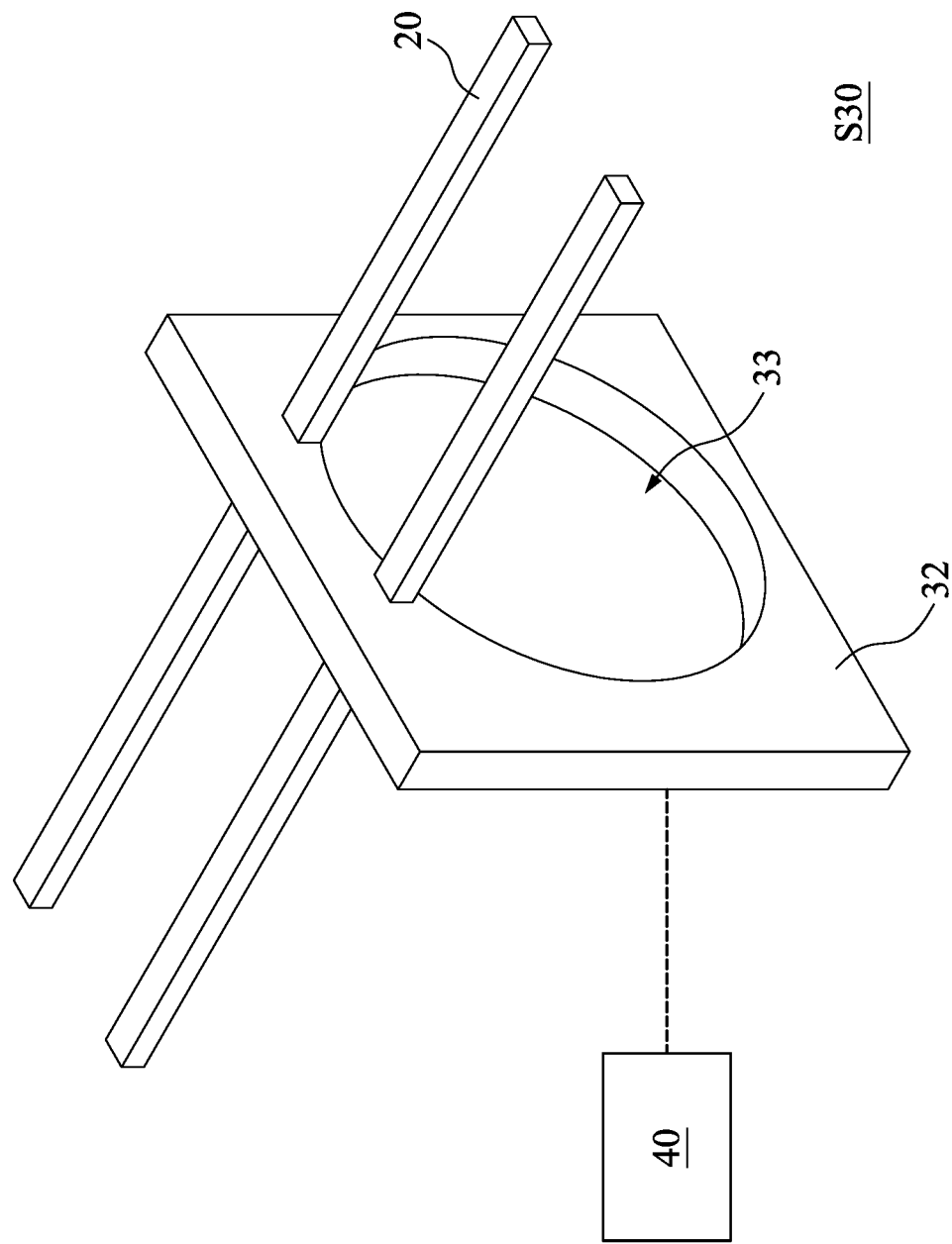
FIG. 9 is a schematic diagram of a system for monitoring a carrier in accordance with some embodiments of the present disclosure.

The scanner 30 shown in FIG. 3 is configured to scan the carrier C10 along a horizontal direction, and thus the scanning is performed on an upper portion or a lower portion of the carrier C10. However, the present disclosure is not limited thereto. In other embodiments, as shown in FIGS. 9 to 12 (detailed description is provided in the following paragraphs), the carrier C10 can be scanned along a vertical direction by a scanner 32. As shown in FIGS. 4 and 9, the scanner 32 scans a lateral portion of the carrier C10 along a vertical direction. In some embodiments, a distance D12 between the inner sidewall S12 and a closest substrate SB is about 6.5 cm. In some embodiments, the scanner 32 scans the carrier C10 along a vertical plane (i.e., a scanning plane P32 shown in FIGS. 10 to 12) away from the inner sidewall S12 by a distance greater than zero and less than 6.5 cm (wherein the scanning plane P32 is substantially parallel to the inner sidewall S12) for a purpose of prevention of signal interference. In some embodiments, a distance D14 between the inner sidewall S14 and a closest substrate SB is about 6.5 cm. In some embodiments, the scanner 32 scans the carrier C10 along a vertical plane away from the inner sidewall S14 by a distance greater than zero and less than 6.5 cm (wherein the scanning plane P32 is substantially parallel to the inner sidewall S14) for a purpose of prevention of signal interference. In some embodiments, a distance D15 between the inner sidewall S15 and a closest substrate SB is about 2 cm. In some embodiments, the scanner 32 scans the carrier C10 along a vertical plane away from the inner sidewall S15 by a distance greater than zero and less than 2 cm (wherein the scanning plane P32 is substantially parallel to the inner sidewall S15) for a purpose of prevention of signal interference. In some embodiments, a distance D16 between the inner sidewall S16 and a closest substrate SB is about 3 cm. In some embodiments, the scanner 32 scans the carrier C10 along a vertical plane away from the inner sidewall S16 by a distance greater than zero and less than 3 cm for a purpose of prevention of signal interference.

Figure 6:
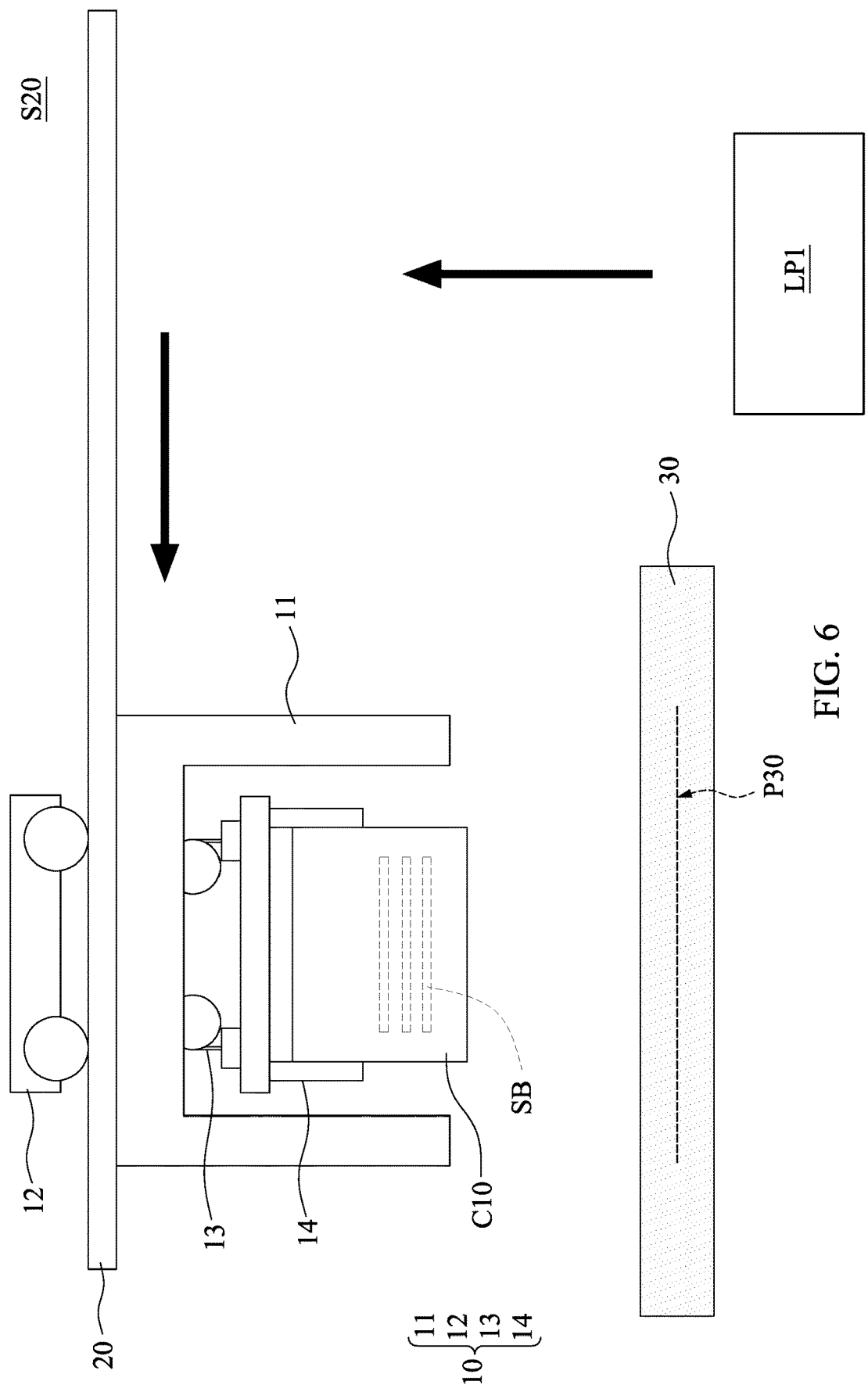
FIGS. 6 to 8 are schematic diagrams showing different stages of a scanning process applied in a method of manufacturing a semiconductor structure in accordance with some embodiments of the present disclosure.
Figure 7:
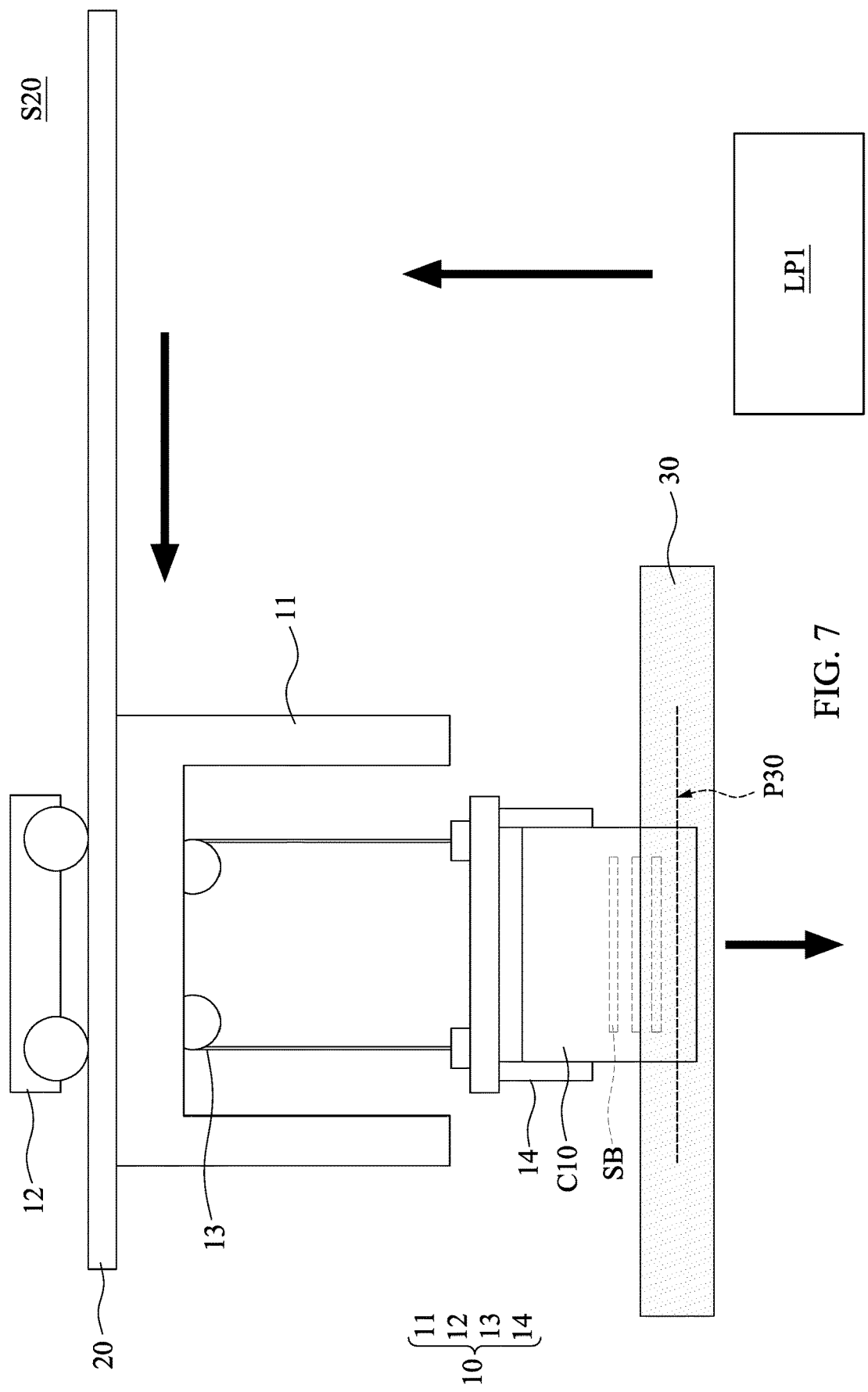
Figure 8:
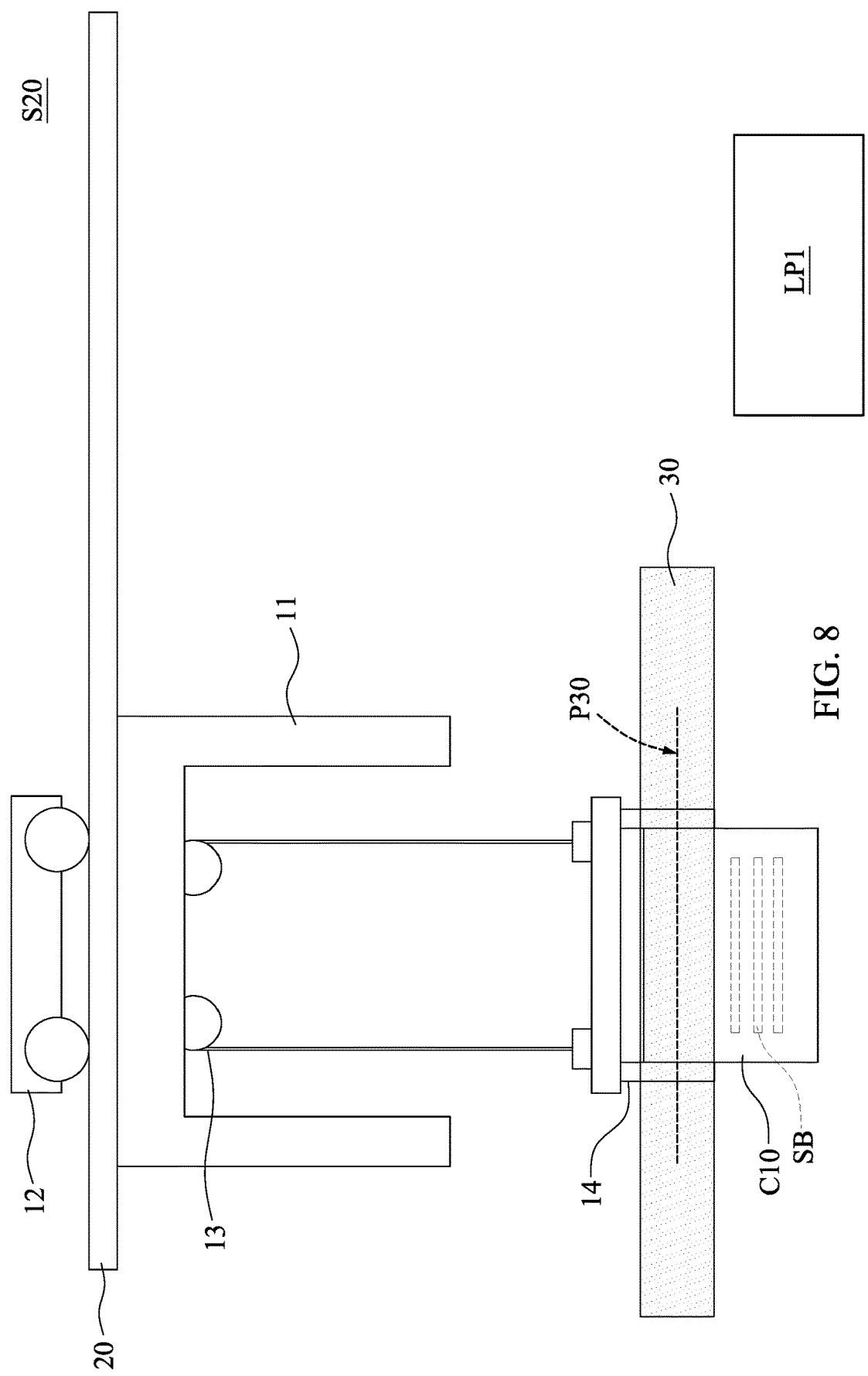

FIGS. 6 to 8 are schematic diagrams showing different stages of a scanning process applied in a method of manufacturing a semiconductor structure in accordance with some embodiments of the present disclosure. In some embodiments, the carrier C10 is gripped by the gripping member 14 and lifted from a load port LP1 by the hoisting member 13 of the OHT vehicle 10 prior to the scanning operation. In some embodiments, the carrier C10 is moved toward the scanner 30 by the travelling member 12 along the rail 20 after the lifting of the carrier C10. The OHT vehicle 10 stops over the scanner 30 to vertically align the carrier C10 over the passage 31 of the scanner 30. In some embodiments, the movement of the OHT vehicle 10 is controlled by the control unit 15 shown in FIG. 2. In some embodiments, the control unit 15 is connected, electrically or wirelessly, to the scanner 30, and the control unit 15 is configured to detect or identify a position of the scanner 30 or receives information of the position of the scanner 30. It should be noted that the scanner 30 scans the carrier C10 along one or more planes, and in the embodiments of the scanner 30 shown in FIGS. 6 to 8, a scanning plane P30 of the scanner 30 indicated by a dotted line should be within the passage 31. Therefore, although FIG. 6 does not show the passage 31, it is understandable that the carrier C10 is vertically aligned with the passage 31 of the scanner 30.

Referring to FIG. 7, in some embodiments, the carrier C10 is next lowered toward the scanner 30 by the hoisting member 13. In some embodiments, a lower portion of the carrier C10 enters the passage 31. In some embodiments, the hoisting member 13 stops the carrier C10 for a duration of a scanning operation performed on the lower portion of the carrier C10. In some embodiments, a distance between the scanning plane P30 and the inner bottom surface S13 shown in FIG. 4 is greater than zero and less than 6 cm. It should be noted that the carrier C10 may or may not include a metallic component 101 as shown in FIG. 3. In some embodiments, the carrier C10 includes a metallic component 101, and the scanning plane P30 avoids both the metallic component 101 and the substrates SB. In addition, FIGS. 6 to 8 illustrate that the carrier C10 carries multiple substrate SB during the scanning operation for a purpose of illustration. As described above, the scanning operation can be performed on an empty carrier C10.

Referring to FIG. 8, in some embodiments, the carrier C10 is next lowered farther by the hoisting member 13 to scan an upper portion of the carrier C10. In some embodiments, the hoisting member 13 stops the carrier C10 so as to hold the carrier C10 at a certain horizontal level for a duration of a scanning operation performed on the upper portion of the carrier C10. In some embodiments, a distance between the scanning plane P30 and the inner top surface S11 shown in FIG. 4 is greater than zero and less than 4 cm. Similarly, the scanning operation performed on the upper portion of the carrier C10 should avoid the substrates SB or the metallic components 101 if they are present in or on the carrier C10.

Since different chemicals have different weights, a gas composition at the lower portion of the carrier C10 may be different from a gas composition at the upper portion of the carrier C10. Therefore, scanning operations performed on different horizontal levels of the carrier C10 can ensure the scanning results are comprehensive. In some embodiments, the scanning result of the scanning operation performed on the upper portion of the carrier C10 shows a gas composition that includes at least one of hydrogen ($H_2$), ammonia ($NH_3$), and dihydrogen oxide ($H_2O$). In some embodiments, the scanning result of the scanning operation performed on the lower portion of the carrier C10 shows a gas composition that includes chlorine ($Cl_2$).

FIG. 9 is a schematic diagram of a system S30 for monitoring a carrier C10 in accordance with some embodiments of the present disclosure. The system S30 is similar to the system S20 shown in FIG. 3 but with a scanner 32 having a scanning plane along a vertical direction. In some embodiments, the scanner 32 surrounds the rail 20. In some embodiments, the rail 20 passes through a passage 33 of the scanner 32. In some embodiments, the scanner 32 physically contacts the rail 20. In some embodiments, the scanner 32 connects the rail 20. In some embodiments, the scanner 32 is mounted on the rail 20. Functions of the scanner 32 can be similar to those of the scanner 30, and repeated description is omitted herein.

Figure 10:
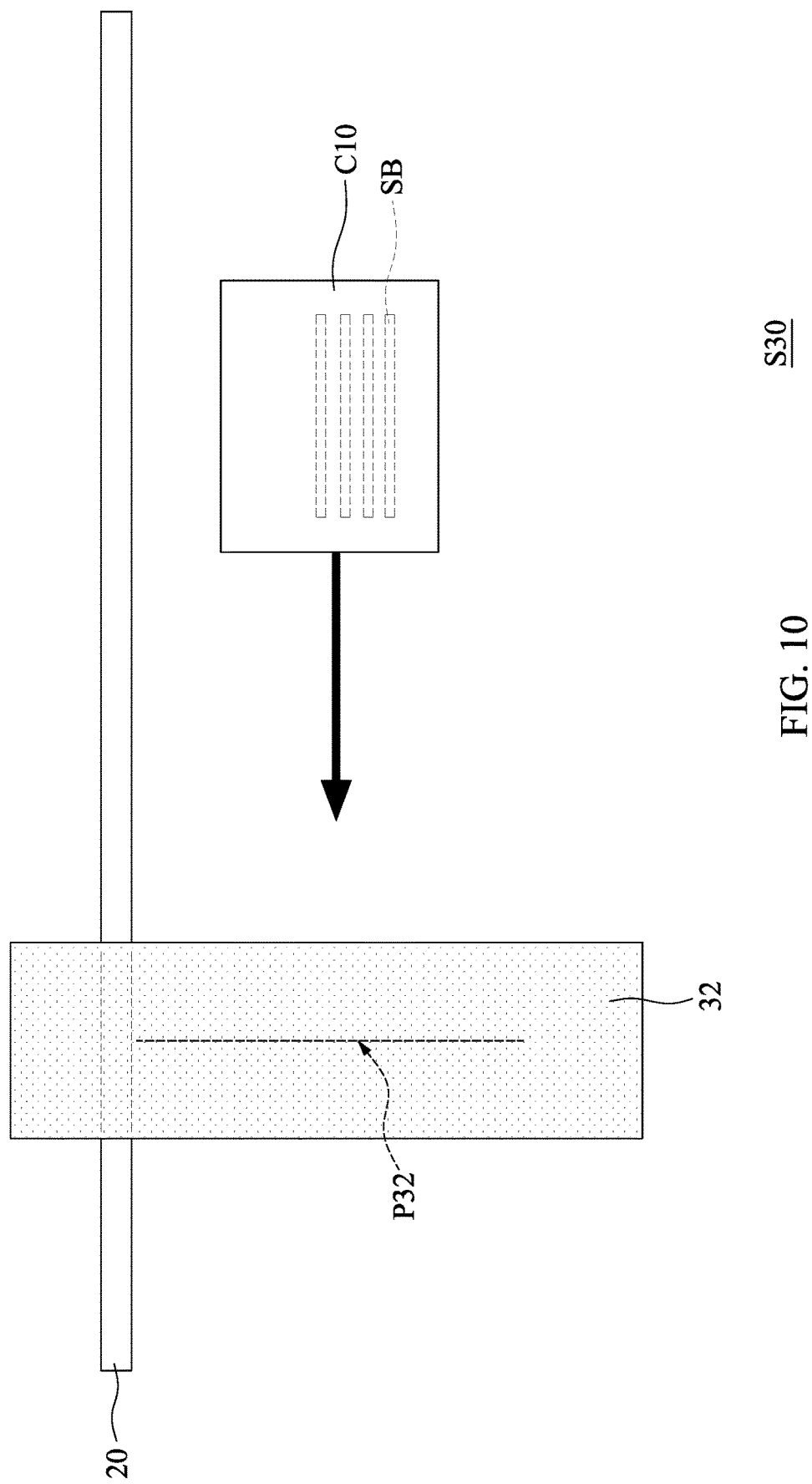
FIGS. 10 to 12 are schematic diagrams showing different stages of a scanning process applied in a method of manufacturing a semiconductor structure in accordance with some embodiments of the present disclosure.
Figure 11:
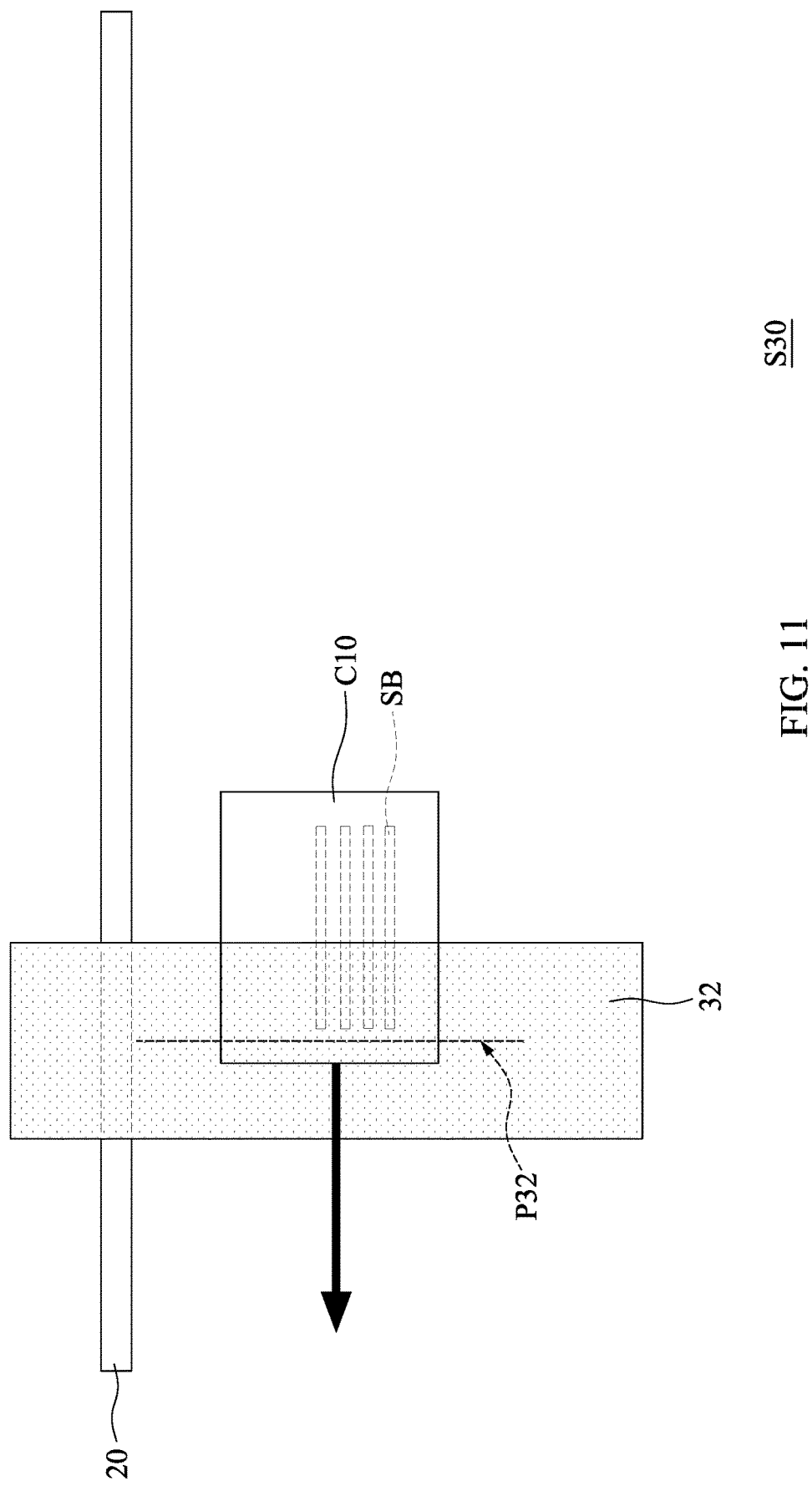
Figure 12:
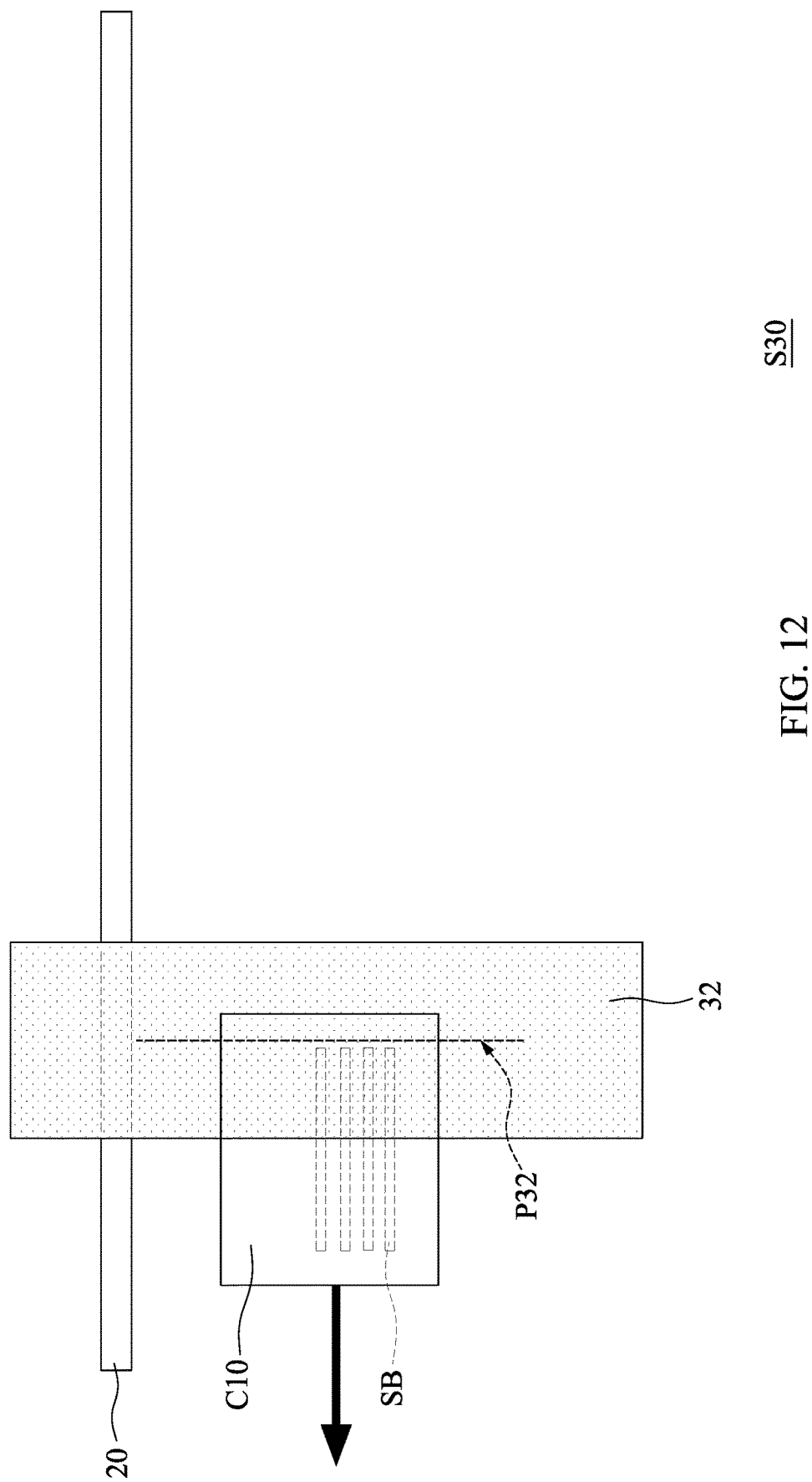

FIGS. 10 to 12 are schematic diagrams showing different stages of a scanning process applied in a method of manufacturing a semiconductor structure in accordance with some embodiments of the present disclosure.

Referring to FIG. 10, the carrier C10 is moved toward the scanner 32 along the rail 20 in a horizontal direction. Similar to the embodiments shown in FIG. 6, the carrier C10 can be gripped by the gripping member 14 and lifted from a load port by the hoisting member 13 of the OHT vehicle 10 prior to the scanning operation. It should be noted that the OHT vehicle 10 is omitted from FIGS. 10 to 12 for a purpose of simplicity. However, details of the OHT vehicle 10 can be found in the description above, and such omission is not intended to limit the present disclosure. In some embodiments, the housing 11 is made of plastic or non-magnetic material, and the scanning operation can be performed when the OHT vehicle 10 is in a retracted state. In some embodiments, the carrier C10 is at least partially outside the housing 11 when the OHT vehicle 10 is in the retracted state. In some embodiments, the carrier C10 is entirely outside the housing 11 when the OHT vehicle 10 is in the retracted state. In some embodiments, the housing 11 is removable or can be uninstalled from the OHT vehicle 10 during the scanning operation if the housing 11 includes magnetic components. In some embodiments, the carrier C10 is moved toward the scanner 30 by the travelling member 12 along the rail 20 after the lifting of the carrier C10. A moving direction of the carrier C10 is indicated in FIGS. 10 to 12 by a thick arrow.

Referring to FIG. 11, in some embodiments, the hoisting member 13 stops the carrier C10 for a duration of a scanning operation performed on a front portion (i.e., a lateral portion facing frontward) of the carrier C10. A distance between a scanning plane P32 and an inner sidewall S12, S14, S15 or S16 of the carrier C10 depends on a direction of the carrier C10. In some embodiments, the distance between the scanning plane P32 and the inner sidewall S12 or S14 shown in FIG. 5 is greater than zero and less than 6.5 cm when the inner sidewall S12 or S14 is at a front along the moving direction of the carrier C10. In some embodiments, the distance between the scanning plane P32 and the inner sidewall S15 shown in FIG. 5 is greater than zero and less than 2 cm when the inner sidewall S15 is at the front along the moving direction of the carrier C10. In some embodiments, the distance between the scanning plane P32 and the inner sidewall S16 shown in FIG. 5 is greater than zero and less than 3 cm when the inner sidewall S16 is at the front along the moving direction of the carrier C10.

Referring to FIG. 12, in some embodiments, the hoisting member 13 stops the carrier C10 for a duration of a scanning operation performed on a back portion (i.e., a lateral portion facing backward) of the carrier C10. As described above, gas compositions at lower and upper portions of the carrier C10 can be different due to different weights of chemicals. However, gas compositions at the front and back portions of the carrier C10 can be substantially identical. Therefore, the scanning operation can be performed on one of the front and back portions of the carrier C10 for a purpose of control of manufacturing cost. In some embodiments, the scanning operations are performed on both the front and back portions of the carrier C10. In some embodiments, the scanning results of the front and back portions of the carrier C10 are compared and combined to provide a more accurate or comprehensive result of the gas composition.

It should be noted that MRS or MRI is sensitive to an environmental magnetic field, especially when the scanner 30 or 32 is disposed in a semiconductor fabrication (FAB) site (the site for fabricating semiconductors) and scanning operations are performed in the FAB site. For a purpose of prevention of signal interference, a shielding structure can be included in the system S20 or S30.

Figure 13:
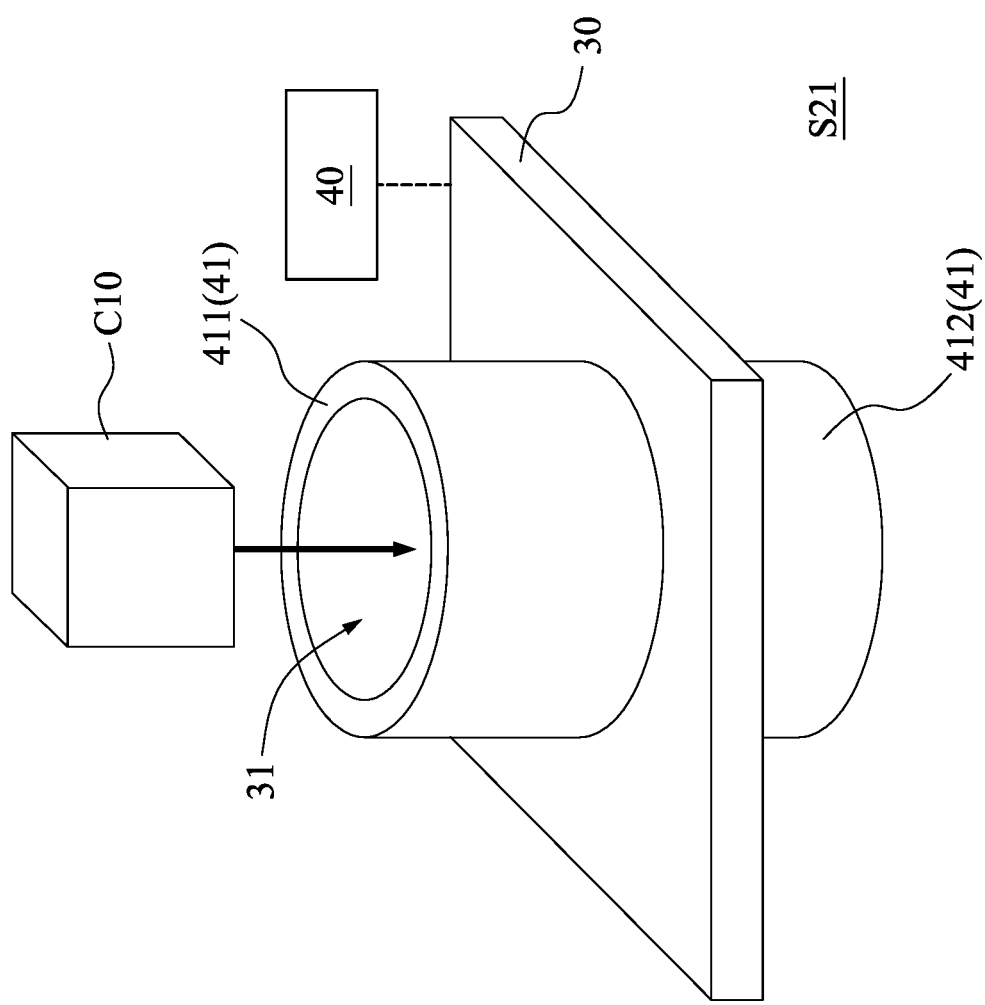
FIG. 13 is a schematic diagram of a system for monitoring a carrier in accordance with some embodiments of the present disclosure.

FIG. 13 shows a schematic diagram of a system S21 for monitoring a carrier C10 in accordance with some embodiments of the present disclosure. The system S21 can be similar to the system S20 shown in FIG. 3 but further includes a shielding structure 41. A function of the shielding structure 41 is similar to a function of a Faraday cage. The shielding structure 41 serves to block electromagnetic fields as much as possible. However, in order to let the carrier C10 pass through the scanner 30, the shielding structure 41 surrounds a scanning plane of the scanner 30 without enclosing the scanner 30. The shielding structure 41 may include suitable conductive materials, and is not limited herein. In some embodiments, the shielding structure 41 is connected to the scanner 30 along an edge of a passage 31. In some embodiments, the shielding structure 41 is a cylinder-like structure extending from two opposite sides of the scanner 30. In some embodiments, the shielding structure 41 includes a first shielding portion 411 and a second shielding portion 412 at two opposite sides of the scanner 30. In some embodiments, the first shielding portion 411 includes a through hole in connection with a through hole of the second shielding portion 412. In some embodiments, the first and second shielding portions 411 and 412 together define a through hole extending along a vertical direction, which is substantially perpendicular to a scanning plane of the scanner 30. In some embodiments, the first shielding portion 411 and the second shielding portion 412 together define the passage 31. In some embodiments, the passage 31 is elongated by the shielding structure 41, such that the passage 31 is longer than the passage 31 of the system 20.

Figure 14:
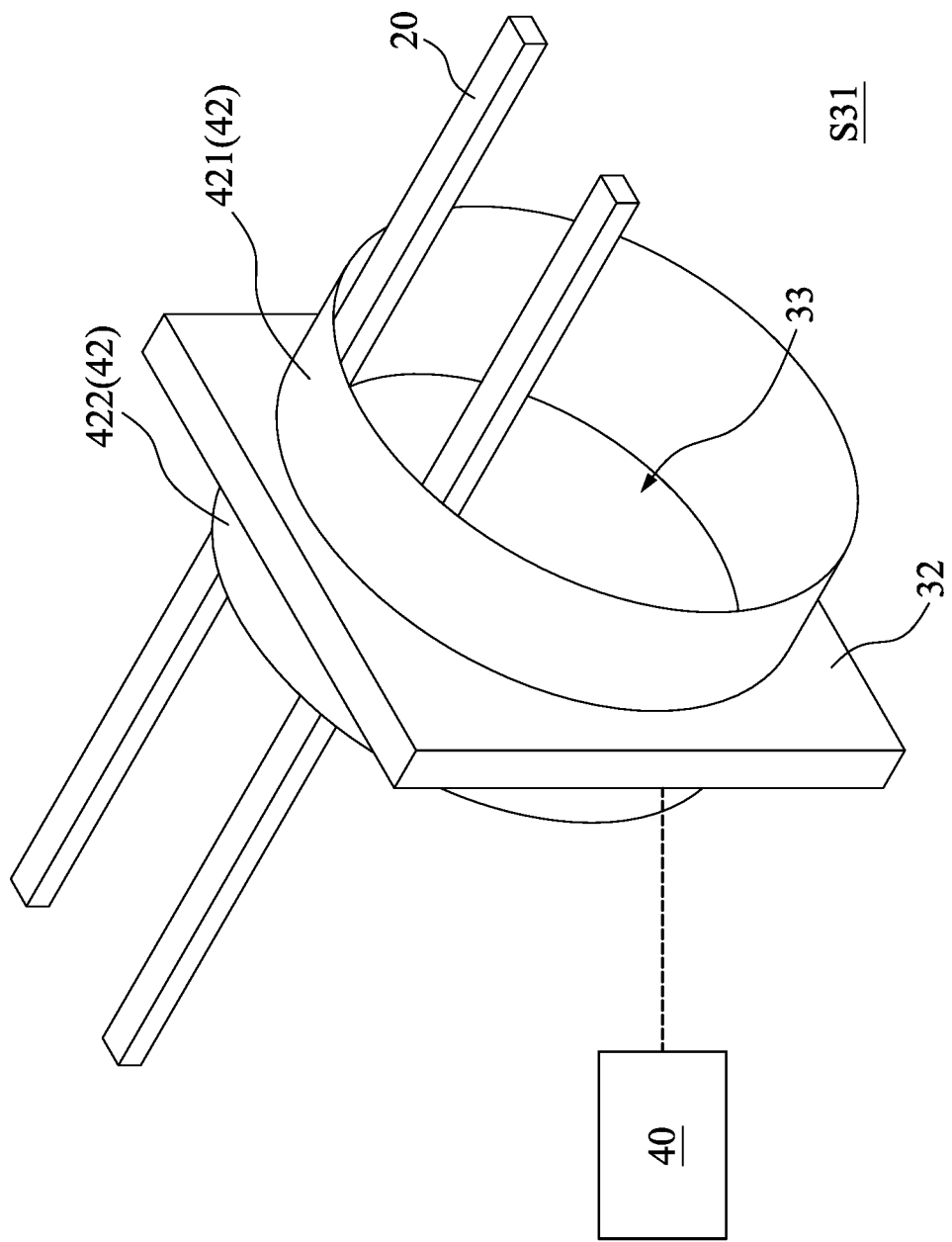
FIG. 14 is a schematic diagram of a system for monitoring a carrier in accordance with some embodiments of the present disclosure.

FIG. 14 shows a schematic diagram of a system S31 for monitoring a carrier C10 in accordance with some embodiments of the present disclosure. The system S31 can be similar to the system S30 shown in FIG. 9 but further includes a shielding structure 42. A function of the shielding structure 42 is similar to the function of the shielding structure 41 shown in FIG. 13. The shielding structure 42 serves to block electromagnetic fields as much as possible. However, in order to let the carrier C10 pass through the scanner 32, the shielding structure 42 surrounds a scanning plane of the scanner 32 without enclosing the scanner 32. The shielding structure 42 may include suitable conductive materials, and is not limited herein. In some embodiments, the shielding structure 42 is connected to the scanner 32 along an edge of the passage 33. In some embodiments, the shielding structure 42 is a cylinder-like structure extending from two opposite sides of the scanner 32. In some embodiments, the shielding structure 42 includes a first shielding portion 421 and a second shielding portion 422 at two opposite sides of the scanner 32. In some embodiments, the first shielding portion 421 includes a through hole in connection with a through hole of the second shielding portion 422. In some embodiments, the first and second shielding portions 421 and 422 together define a through hole extending along a horizontal direction, which is substantially perpendicular to a scanning plane of the scanner 32. In some embodiments, the first shielding portion 421 and the second shielding portion 422 together define the passage 33. In some embodiments, the passage 33 is elongated by the shielding structure 42, such that the passage 33 is longer than the passage 31 of the system 20.

To conclude the processes of different embodiments as described above, a method 700 is provided.

Figure 15:
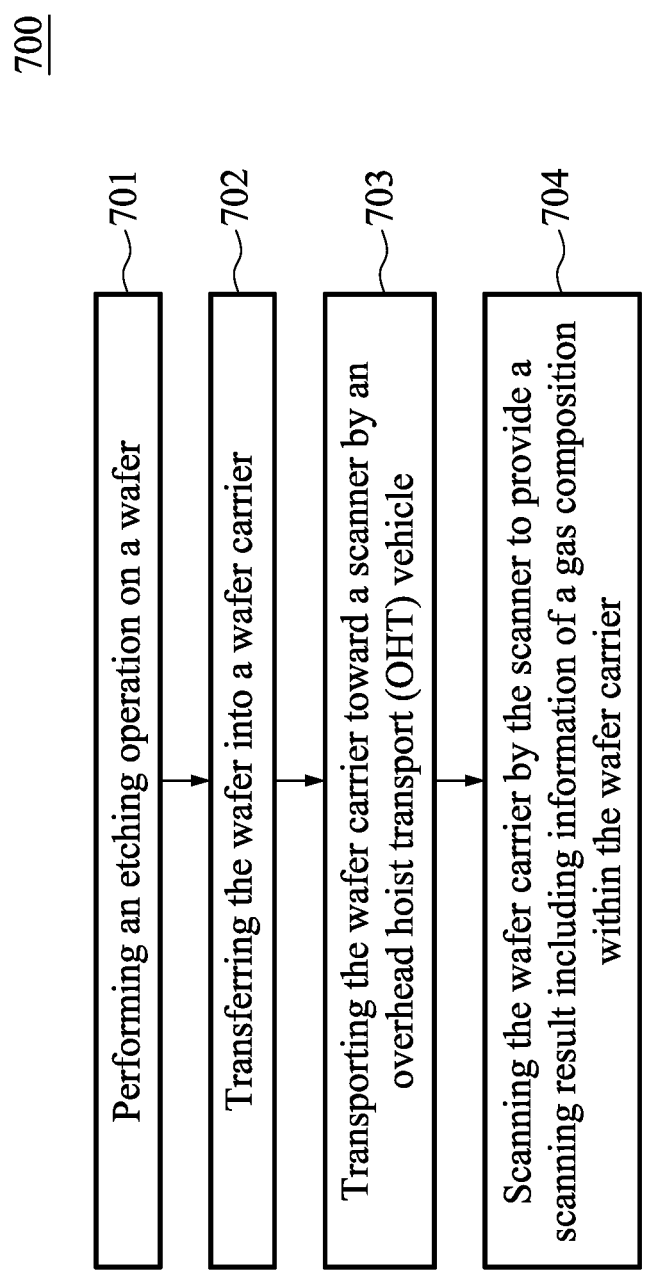
FIG. 15 is a flow diagram of a method of manufacturing a semiconductor structure in accordance with different embodiments of the present disclosure.

FIG. 15 is a flow diagram of the method 700 for manufacturing a semiconductor structure in accordance with some embodiments of the present disclosure. The method 700 includes a number of operations (701, 702, 703, and 704), and the description and illustration are not deemed as a limitation to the sequence of the operations. In the operation 701, an etching operation is performed on a wafer. In the operation 702, the wafer is transferred into a wafer carrier. In the operation 703, the wafer carrier is transported toward a scanner by an overhead hoist transport (OHT) vehicle. In the operation 704, the wafer carrier is scanned by the scanner to provide a scanning result including information of a gas composition within the wafer carrier.

It should be noted that the operations of the method 700 can be rearranged or otherwise modified within the scope of the various aspects. In some embodiments, additional processes are provided before, during, and after the method 700, and some other processes are only briefly described herein. Thus, other implementations are possible within the scope of the various aspects described herein.

In accordance with some embodiments of the disclosure, a system for monitoring a wafer carrier is provided. The system includes an overhead hoist transport (OHT) vehicle, a scanner, and a processer. The OHT vehicle is configured to transport the wafer carrier along a vertical direction. The scanner is disposed below the OHT vehicle, wherein the wafer carrier is transported vertically by the OHT vehicle to pass through the scanner, and the scanner at least scans a lower portion of the wafer carrier along a horizontal direction and an upper portion of the wafer carrier along the horizontal direction. The processor is coupled to the scanner, wherein the processor receives a scanning result from the scanner after the wafer carrier is scanned, and the scanning result includes information of a gas composition within the wafer carrier.

In accordance with some embodiments of the disclosure, a system for monitoring a wafer carrier is provided. The system includes an overhead hoist transport (OHT) vehicle, a scanner, and a processer. The OHT vehicle is configured to transport the wafer carrier along a rail. The scanner connects to the rail, wherein the wafer carrier is transported along the rail to pass through the scanner, and the scanner scans at least a lateral portion of the wafer carrier along a vertical direction. The processor is coupled to the scanner, wherein the processor receives a scanning result from the scanner after the wafer carrier is scanned, and the scanning result includes information of a gas composition within the wafer carrier.

In accordance with some embodiments of the disclosure, a method for manufacturing a semiconductor structure is provided. The method may include several operations. An etching operation is performed on a wafer. The wafer is transferred into a wafer carrier. The wafer carrier is transported toward a scanner by an overhead hoist transport (OHT) vehicle. The wafer carrier is scanned by the scanner to provide a scanning result including information of gas composition within the wafer carrier.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
    performing an etching operation on a wafer;
    transferring the wafer into a wafer carrier;
    transporting the wafer carrier toward a scanner by an overhead hoist transport (OHT) vehicle; and
    scanning the wafer carrier by the scanner to provide a scanning result including information of a gas composition within the wafer carrier.

2. The method of claim 1, wherein the wafer is transferred into the wafer carrier after the etching operation, and the wafer carrier is scanned while the wafer is inside the wafer carrier.

3. The method of claim 2, further comprising:
    introducing an inert gas into the wafer carrier, wherein residues on the wafer from the etching operation are mixed with the inert gas.

4. The method of claim 1, wherein the wafer is transferred into the wafer carrier after the wafer carrier is scanned, and the scanning is performed on the wafer carrier while no wafer is inside the wafer carrier.

5. The method of claim 1, further comprising:
    transmitting the scanning result to a storage unit.

6. The method of claim 1, further comprising:
    comparing the scanning result to a standard data by a processor.

7. The method of claim 1, wherein the gas composition includes at least one of hydrogen ($H_2$), ammonia ($NH_3$), dihydrogen oxide ($H_2O$), and chlorine ($Cl_2$).

8. The method of claim 1, wherein the information further includes concentrations of elements of the gas composition.

9. A method of manufacturing a semiconductor structure, comprising:
    receiving a wafer carrier from a load port;
    transporting the wafer carrier along a first direction;
    aligning the wafer carrier with a scanner in a second direction different from the first direction; and
    scanning the wafer carrier by the scanner to provide a scanning result including information of a gas composition within the wafer carrier.

10. The method of claim 9, further comprising disposing at least a wafer in the wafer carrier, and the wafer carrier is scanned while the wafer is inside the wafer carrier.

11. The method of claim 9, further comprising disposing at least a wafer in the wafer carrier after the scanning of the wafer carrier.

12. The method of claim 9, wherein the scanning of the wafer further comprises scans the wafer carrier, by the scanner, at a horizontal level below an inner top surface of the wafer carrier by a distance.

13. The method of claim 12, wherein the distance is greater than zero and less than 4 centimeters.

14. The method of claim 9, wherein the scanning of the wafer carrier comprises a magnetic resonance spectroscopy (MRS) or magnetic resonance imaging (MRI).

15. The method of claim 9, wherein the gas composition includes at least one of hydrogen ($H_2$), ammonia ($NH_3$), dihydrogen oxide ($H_2O$), and chlorine ($Cl_2$).

16. The method of claim 9, wherein the information further includes concentrations of elements of the gas composition.

17. A method of manufacturing a semiconductor structure, comprising:
    transporting a wafer carrier along a rail in a direction, wherein a scanner is connected to the rail, and the scanner comprises a passage;
    transporting the wafer carrier in the direction to pass through the passage of the scanner; and
    scanning the wafer carrier while passing the scanner to provide a scanning result including information of a gas composition within the wafer carrier.

18. The method of claim 17, wherein the wafer carrier has at least a wafer disposed therein, and the wafer carrier is scanned while the wafer is inside the wafer carrier.

19. The method of claim 17, wherein the scanning of the wafer carrier comprises a magnetic resonance spectroscopy (MRS) or magnetic resonance imaging (MRI).

20. The method of claim 17, wherein the gas composition includes at least one of hydrogen ($H_2$), ammonia ($NH_3$), dihydrogen oxide ($H_2O$), and chlorine ($Cl_2$).

* * * * *